(12) United States Patent
Ku et al.

(10) Patent No.: US 7,484,931 B2
(45) Date of Patent: Feb. 3, 2009

(54) FRAME FOR AN ELECTRICAL FAN

(75) Inventors: Chin-Long Ku, Tu-Cheng (TW); Chin-Wen Yeh, Tu-Cheng (TW); Hai-Tao Lv, Shen-Zhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 680 days.

(21) Appl. No.: 11/135,170

(22) Filed: May 23, 2005

(65) Prior Publication Data
US 2006/0013686 A1   Jan. 19, 2006

(30) Foreign Application Priority Data
Jul. 16, 2004   (CN) .................... 2004 1 0028187

(51) Int. Cl.
F04D 29/056   (2006.01)
(52) U.S. Cl. ..................................... 415/229
(58) Field of Classification Search ............... 415/229; 417/423.12; 310/91
See application file for complete search history.

(56) References Cited

U.S. PATENT DOCUMENTS

| | | | |
|---|---|---|---|
| 5,245,236 A | 9/1993 | Horng | |
| 6,246,140 B1 * | 6/2001 | Horng | 310/91 |
| 6,398,526 B1 | 6/2002 | Yang | |
| 6,498,412 B2 * | 12/2002 | Horng | 310/91 |
| 6,544,011 B2 * | 4/2003 | Hsieh | 417/423.7 |
| 6,756,714 B2 * | 6/2004 | Alex et al. | 310/90 |
| 6,832,853 B2 * | 12/2004 | Fujinaka | 384/100 |

FOREIGN PATENT DOCUMENTS

| | | |
|---|---|---|
| CN | 00238113.3 | 5/2001 |
| CN | 2620119 Y | 6/2004 |
| JP | 2000-257585 A | 9/2000 |
| TW | 87211671 | 10/1999 |

* cited by examiner

Primary Examiner—Ninh H Nguyen

(57) ABSTRACT

A frame (10) for an electrical fan includes a bracket (20) and a bearing support (30) located at the center of the bracket. The bearing support includes a metal tube (50) and a plastic body (40) connecting with the metal tube. The metal tube defines at least one connecting hole (52) in a wall thereof. The plastic body includes an inner portion (42) located inside the metal tube, an outer portion (44) located outside the metal tube, and a connecting portion (46) located in the connecting hole and integrally connecting the inner and the outer portions of the plastic body. The inner portion is used for engaging with two bearings (60) for rotatably connecting with a rotor shaft of the electrical fan.

16 Claims, 2 Drawing Sheets

FRAME FOR AN ELECTRICAL FAN

TECHNICAL FIELD

The present invention relates generally to an electrical fan, and more particularly to a fan frame for a miniature electrical fan used in a computer for dissipating heat generated by electronic components of the computer.

BACKGROUND

An electrical fan usually includes a frame, a bearing support formed at a middle of the frame, a stator disposed around the bearing support, and a rotor rotatably mounted surrounding the stator. The bearing support is for receiving a bearing therein. The bearing rotatably supports a rotor shaft which is connected with the rotor. The bearing support is usually made of plastic, and includes a central tube for positioning the stator. The heat generated by electronic components increases as the power of the electronic components grows. In order to dissipate this heat, the fan will need high rotating speed to drive the rotor to generate more airflow, which results in the increase of the heat generated by the motor of the fan consisting of the stator, rotor, bearing support, bearing and rotor shaft. With the accumulation of the heat, the plastic tube of the motor will become soften and deformed when the temperature of the motor rises beyond a predetermined value. This leads the fan to become vibrant and noisy when it works, and reduces the life of the fan.

In order to solve this problem, another fan frame having better heat-resistant and heat-conductivity ability has been proposed. The frame includes a plastic bracket and a metal tube connected with the bracket. Because the metal tube has good heat-resistant ability, it will not unduly deform when the temperature increases. The metal tube can also dissipate the heat generated by the motor to the environment because of its good heat-conductivity, resulting in the temperature of the fan motor stayed at a low level.

The metal tube is usually molded with the plastic bracket. To strengthen the connection of the metal tube and the plastic bracket, an outer connecting surface of the metal tube is formed with grooves or indents. However, forming processes of the grooves or the indents on the metal tube are complicated and therefore costly.

In addition, to precisely position the bearing in the metal tube, an inner surface of the metal tube needs to be processed to obtain an acceptably precise hole size. This also increases the cost of the metal tube. Further, once the tube is determined, it only fits bearings of a specific size. If the size of the bearings is changed, the metal tube cannot be used. What is needed, therefore, is an improved fan frame for a heat dissipating fan.

SUMMARY OF THE INVENTION

According to a preferred embodiment of the present invention, a frame for an electrical fan includes a bracket and a bearing support located at the center of the bracket. The bearing support includes a metal tube and a plastic body connecting with the metal tube. The metal tube defines at least one connecting hole in a wall thereof. The plastic body includes an inner portion located inside the metal tube, an outer portion located outside the metal tube, and a connecting portion located in the connecting hole and integrally connecting the inner and the outer portions of the plastic body. The inner portion of the plastic body engages two coaxially arranged bearings. The bearings are used for rotatably connecting with a rotor shaft of the electrical fan.

Other advantages and novel features of the present invention will become more apparent from the following detailed description of preferred embodiment when taken in conjunction with the accompanying drawings, in which:

DETAILED DESCRIPTION OF PREFERRED EMBODIMENT

Figure 1:
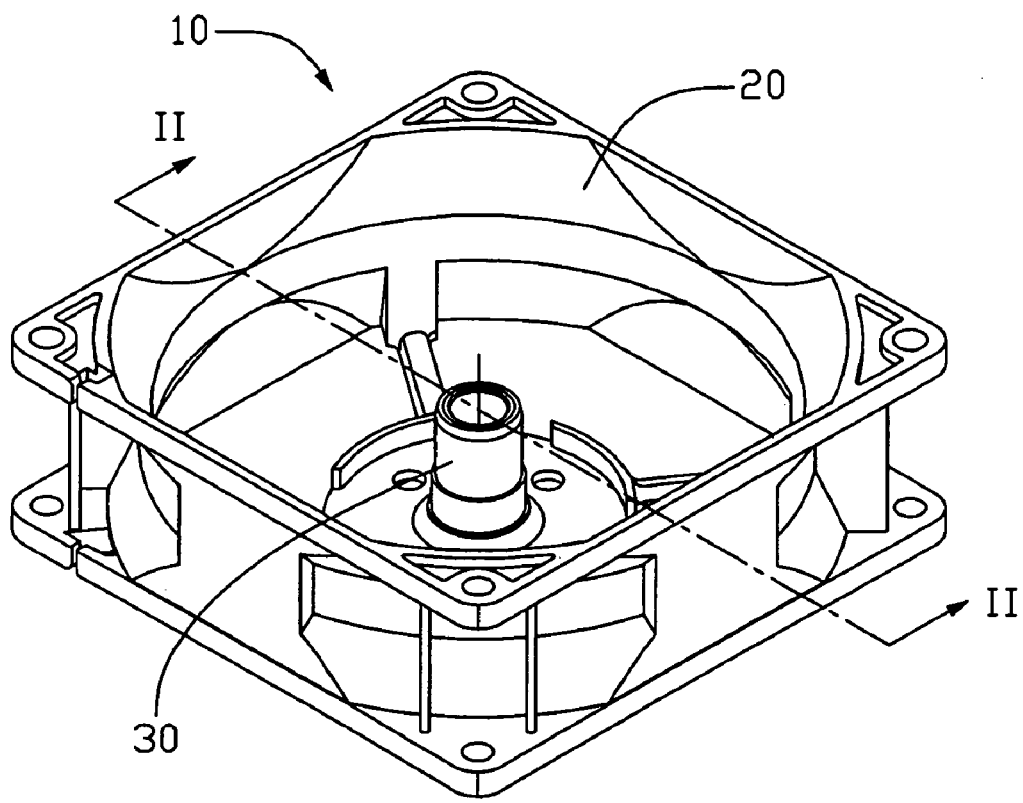
FIG. 1 is an isometric view of a fan frame according to a preferred embodiment of the present invention.

According to FIG. 1, a fan frame 10 for a heating dissipating fan includes a bracket 20 and a bearing support 30 located at a center of the frame 10.

Figure 2:
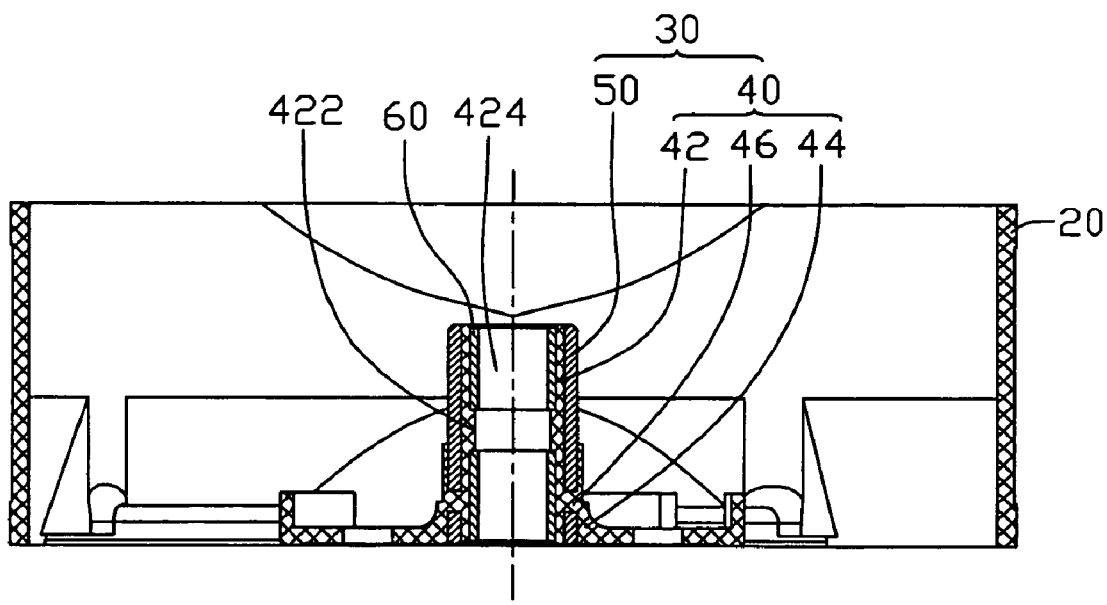
FIG. 2 is a cross sectional view of FIG. 1 taken along lines 11-11 thereof.

According to FIG. 2, the bearing support 30 includes a plastic body 40 integrally formed with the bracket 20 and a tube 50 joined with the plastic body 40.

Figure 3:
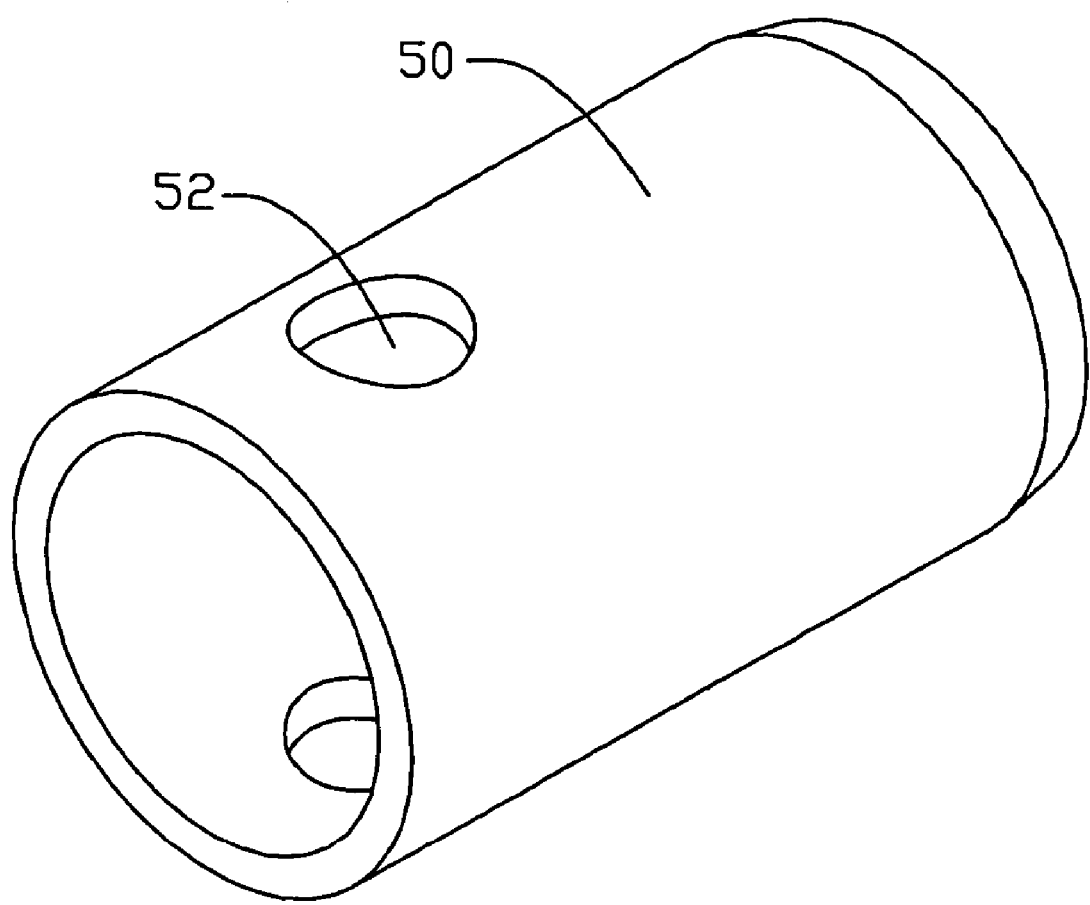
FIG. 3 is an isometric view of a tube of FIGS. 1 and 2.

Referring also to FIG. 3, the tube 50 is made of materials having good heat-resistant and heat-conductivity ability. Metal such as copper may be adopted. The tube 50 defines two connecting holes 52 radially through a wall of the tube 50 near a bottom end thereof. The connecting holes 52 are round in the preferred embodiment, and may be other shape such as, for example, triangle, square.

Referring back to FIG. 2, the plastic body 40 includes a column shaped inner portion 42 located inside the tube 50, an outer portion 44 surrounding a bottom outer periphery of the tube 50, and two connecting portions 46 received in the connecting holes 52 for integrally connecting the inner portion 42 and outer portion 44 of the plastic body 40. A generally middle inner periphery of the inner portion 42 radially and inwardly protrudes, to form an annular flange 422 thereat. Two receiving holes 424 are thus defined above and below the flange 422 for engagingly receiving two bearings 60 respectively therein. A rotor shaft (not shown) can be rotatably received in bearing holes of the bearings 60. The receiving holes 424 are coaxially aligned with each other. The bearings 60 received in the receiving holes 424 are thus also coaxially arranged.

In manufacturing the frame, molten plastic is injected into spaces between the tube 50 and a mold, and flows through the connecting holes 52 to the inner and outer peripheral of the tube 50. After cooled to its solid form, the plastic forms the inner portion 42 and the outer portion 44 of the plastic body 40.

In the preferred embodiment of the present invention, the inner portion 42 and the outer portion 44 of the plastic body 40 cooperatively sandwich the tube 50 therebetween, and the connecting portions 46 of the plastic body 40 are received in the connecting holes 52. The connection of the plastic body 40 and the metal tube 50 is thus strengthened with low cost. In addition, the inner portion 42 of the plastic body 40, not the metal tube 50, engagingly receives the bearings 60 therein. Therefore, the inner surface of the metal tube 50 needs not to be processed to have a size with a high precision as required in the conventional art. This can reduce the cost further. Also, the size of the inner portion 42 of the plastic body 40 can be easily modified to fit bearings of various sizes.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A frame for an electrical fan comprising:
   a bracket; and
   a bearing support located at a center of the bracket adapted for supporting at least one bearing for a rotor shaft, the bearing support comprising:
   a tube defining at least one connecting hole in a wall thereof; and
   a plastic body comprising an inner portion located inside the tube, an outer portion located outside the tube, and a connecting portion located in the connecting hole and integrally connecting the inner and outer portions of the plastic body, the tube being made of heat-resistant material.

2. The frame as described in claim 1, wherein the tube is made of metal.

3. The frame as described in claim 2, wherein the tube is made of copper.

4. The frame as described in claim 1, wherein the inner portion of the plastic body is column shaped.

5. The frame as described in claim 4, wherein the inner portion forms an annular flange at a middle portion thereof, and two receiving holes adapted for receiving two bearings for the rotor shaft are thus defined above and below the flange.

6. The frame as described in claim 5, wherein the receiving holes are coaxially aligned with each other.

7. The frame as described in claim 1, wherein the outer portion surrounds a bottom and outer periphery of the tube.

8. The frame as described in claim 1, wherein the plastic body is integrally formed with the bracket.

9. The frame as described in claim 1, wherein the plastic body is integrally formed with the bracket.

10. An electrical fan comprising:
    a bracket;
    a bearing support joined with the bracket, the bearing support comprising a metal tube and a first plastic portion attached to an inside of the metal tube; and
    at least one bearing received in the first plastic portion adapted for rotatably supporting a rotor shaft of the electrical fan;
    wherein the bearing support further comprises a second plastic portion attached to an outside of the metal tube;
    wherein the bearing support further comprises a plastic connecting portion integrally connecting the first and second plastic portions; and
    wherein the metal tube defines a connecting hole through a wall thereof, the connecting hole receiving the plastic connecting portion therein.

11. The electrical fan of claim 10, wherein the first plastic portion is column shaped, the first plastic portion defining an inner receiving hole receiving the at least one bearing therein.

12. An electrical fan comprising:
    a bracket made of plastic;
    a bearing support adapted for receiving at least one bearing therein for rotatably supporting a rotor shaft of the electrical fan, the bearing support comprising:
    a metal tube;
    a plastic body integrally formed with the bracket, and having a first portion attached to an inside of the tube and defining a hole adapted for receiving the at least one bearing and a second portion attached to an outside of the tube;
    wherein the tube has at least one hole in a wall thereof, and the plastic body further comprises a third portion integrally connecting the first and second portions and located in the at least one hole of the wall of the tube.

13. The electrical fan of claim 12, wherein the first portion forms an inwardly protruding flange dividing the hole into an upper portion and a lower portion adapted for receiving two bearings therein, respectively, for rotatably supporting the rotor shaft of the electrical fan.

14. The electrical fan of claim 13, wherein the first portion has a major part which is located above the second portion.

15. The electrical fan of claim 14, wherein the metal is copper.

16. The electrical fan of claim 12, wherein the first portion has a major part which is located above the second portion.

\* \* \* \* \*